(12) United States Patent
Iida et al.

(10) Patent No.: US 9,386,249 B2
(45) Date of Patent: Jul. 5, 2016

(54) IMAGE PICKUP APPARATUS

(71) Applicant: CANON KABUSHIKI KAISHA, Tokyo (JP)

(72) Inventors: Satoko Iida, Yokohama (JP); Jun Iba, Yokohama (JP); Itsutaku Sano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/709,338

(22) Filed: May 11, 2015

(65) Prior Publication Data
US 2015/0334328 A1    Nov. 19, 2015

(30) Foreign Application Priority Data

May 15, 2014   (JP) .................................. 2014-101472

(51) Int. Cl.
H04N 5/374    (2011.01)
H04N 5/232    (2006.01)
H04N 5/369    (2011.01)

(52) U.S. Cl.
CPC ......... H04N 5/3742 (2013.01); H04N 5/23212 (2013.01); H04N 5/3696 (2013.01)

(58) Field of Classification Search
CPC .............. H04N 5/3742; H04N 5/3696; H04N 5/23212; H04N 5/2353; H04N 5/235; H04N 5/335; H04N 5/378; H04N 5/315; H04L 27/146; H04L 27/14616; H04L 27/14636; H04L 27/14643; H04L 27/14656; H04L 27/14609
See application file for complete search history.

(56) References Cited

U.S. PATENT DOCUMENTS

| | | | | |
|---|---|---|---|---|
| 8,319,874 B2 * | 11/2012 | Suzuki | ............. | H01L 27/14603 348/308 |
| 8,427,568 B2 * | 4/2013 | Takeda | ............. | H01L 27/14685 257/215 |
| 8,648,944 B2 * | 2/2014 | Iwata | ............... | H01L 27/14609 257/292 |
| 2005/0280054 A1 * | 12/2005 | Park | ................. | H01L 27/14603 257/290 |
| 2014/0146211 A1 * | 5/2014 | Mori | .................... | H04N 5/3575 348/308 |

FOREIGN PATENT DOCUMENTS

JP      2008-193527 A     8/2008

* cited by examiner

*Primary Examiner* — Luong T Nguyen
(74) *Attorney, Agent, or Firm* — Canon USA, Inc., IP Division

(57) ABSTRACT

An image pickup apparatus includes: first and second photoelectric conversion units that are disposed in a semiconductor substrate, are configured to accumulate charges, and are of a first conductivity type; an electrode that is disposed on a region between the first and second photoelectric conversion units and is configured to control an electrical conduction between the first and second photoelectric conversion units; a first semiconductor region that is formed under the electrode and between the first and second photoelectric conversion units, is continuous from the first photoelectric conversion unit to the second photoelectric conversion unit, and is of the first conductivity type; and a second semiconductor region that is formed under the electrode and between the first and second photoelectric conversion units, is provided at a depth different from that of the first semiconductor region, and is of a second conductivity type.

16 Claims, 13 Drawing Sheets

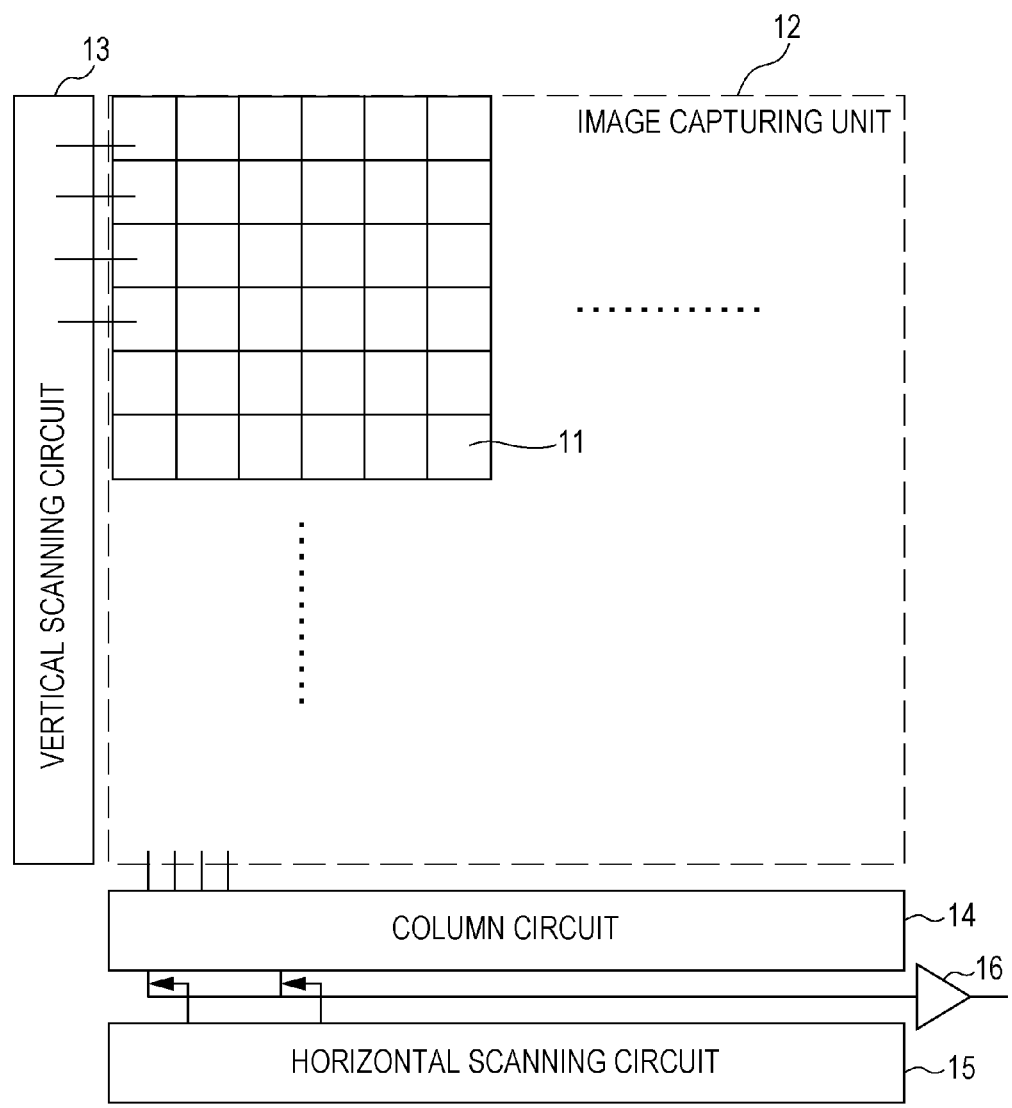

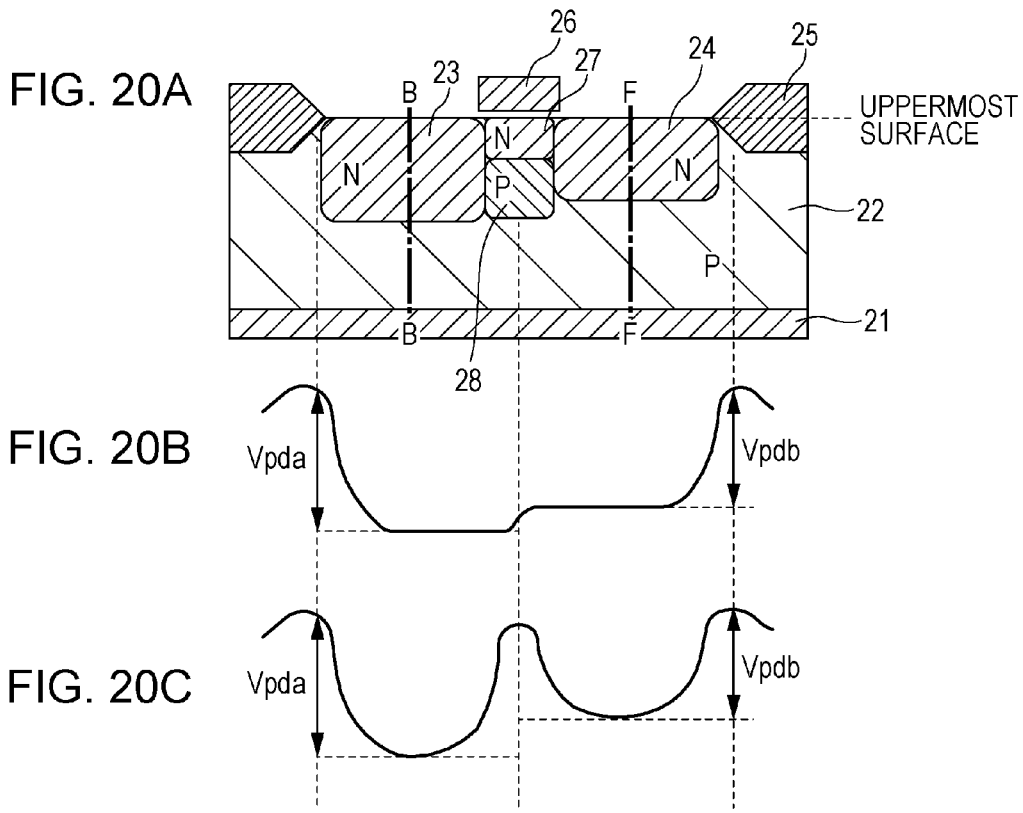
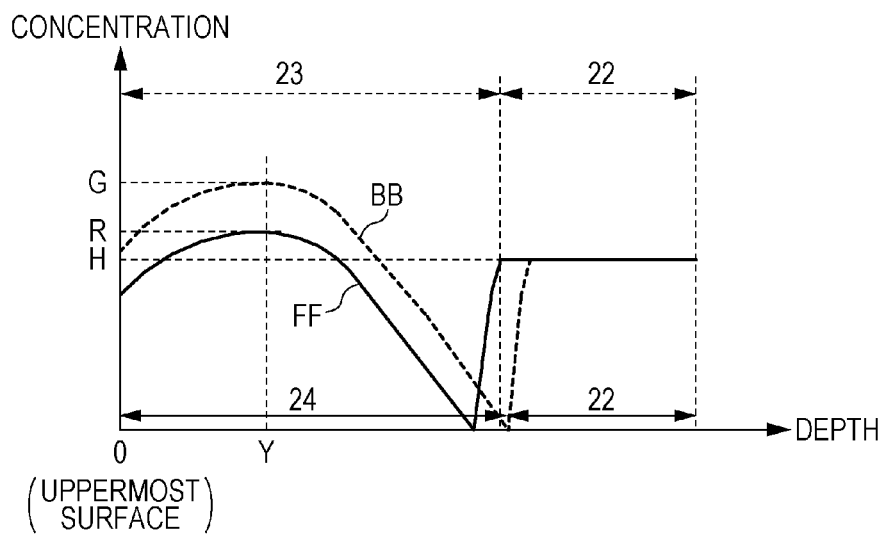

IMAGE PICKUP APPARATUS

BACKGROUND OF THE INVENTION

1. Field of the Invention

The present invention relates to an image pickup apparatus.

2. Description of the Related Art

There is an image pickup apparatus for processing signals generated by a plurality of photoelectric conversion elements as a single pixel signal. Japanese Patent Laid-Open No. 2008-193527 (hereinafter referred to as Patent Document 1) discloses a technique for transferring charges between adjacent photoelectric conversion elements in a column direction and between adjacent photoelectric conversion elements in a row direction and mixing signal charges in the photoelectric conversion elements.

SUMMARY OF THE INVENTION

An embodiment of the present invention provides an image pickup apparatus including: a semiconductor substrate; a first photoelectric conversion unit that is disposed in the semiconductor substrate, is configured to accumulate charges, and is of a first conductivity type; a second photoelectric conversion unit that is disposed in the semiconductor substrate, is configured to accumulate charges, and is of the first conductivity type; an electrode that is disposed on a region between the first photoelectric conversion unit and the second photoelectric conversion unit and is configured to control an electrical conduction between the first photoelectric conversion unit and the second photoelectric conversion unit; a first semiconductor region that is disposed under the electrode and between the first photoelectric conversion unit and the second photoelectric conversion unit, is continuous from the first photoelectric conversion unit to the second photoelectric conversion unit, and is of the first conductivity type; and a second semiconductor region that is disposed under the electrode and between the first photoelectric conversion unit and the second photoelectric conversion unit, is provided at a depth different from that of the first semiconductor region, and is of a second conductivity type. A boundary between the first semiconductor region and the second semiconductor region is located between a surface of the semiconductor substrate and a depth at which an impurity concentration peak of the first photoelectric conversion unit is provided.

Further features of the present invention will become apparent from the following description of exemplary embodiments with reference to the attached drawings.

BRIEF DESCRIPTION OF THE DRAWINGS

FIG. 1 is a diagram illustrating the entire configuration of an image pickup apparatus.

FIG. 20A is a cross-sectional view of a photoelectric conversion unit.

FIGS. 20B and 20C are diagrams illustrating the potential distributions of the photoelectric conversion unit.

FIG. 21 is a diagram illustrating the cross-sectional concentration distribution of a photoelectric conversion unit.

DESCRIPTION OF THE EMBODIMENTS

Figure 2A:
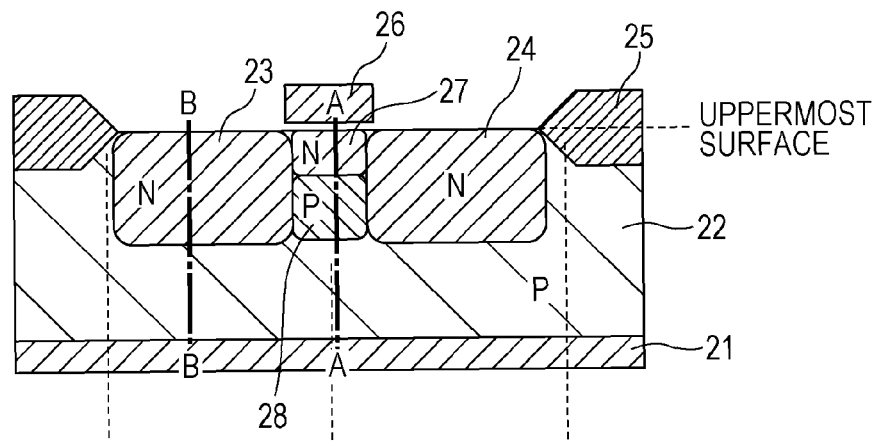
FIG. 2A is a cross-sectional view of a photoelectric conversion unit.

In embodiments of the present invention, a first semiconductor region contributes to the transfer of charges at a low voltage and a second semiconductor region contributes to the improvement in electrical isolation performance. According to an embodiment of the present invention, both the improvement in electrical isolation performance and the transfer of charges at a low voltage can be achieved.

In Patent Document 1, in a region which is located under a transfer gate electrode and between two photoelectric conversion elements, an N-type semiconductor region is not formed. In such a configuration, a high voltage is used at the time of transfer of charges. The reason for this is that a potential under the transfer gate electrode is made to conform to the potentials of photodiodes on the left and right sides. If a low voltage is applied to the transfer gate electrode, a potential barrier is generated between the photodiodes on the left and right sides and the transfer of charges cannot be performed.

In order to control the potential between the two photodiodes on the left and right sides, it is necessary to maintain a high level of performance of electrical isolation between the photodiodes.

According to an embodiment of the present invention, an image pickup apparatus capable of achieving both the improvement in electrical isolation performance and the transfer of charges at a low voltage is provided.

(First Embodiment)

FIG. 1 is a diagram illustrating an exemplary configuration of an image pickup apparatus according to the first embodiment of the present invention. An image pickup apparatus includes a plurality of pixels forming a CCD or CMOS image sensor. In this embodiment, signal charges are electrons. Therefore, a first conductivity type is N-type, and a second conductivity type is P-type. Signal charges may be holes.

When signal charges are holes, a first conductivity type is P-type, and a second conductivity type is N-type.

An image pickup apparatus includes an image capturing unit 12, a vertical scanning circuit 13, a column circuit 14, a horizontal scanning circuit 15, and an output circuit 16. The image capturing unit 12 includes a plurality of unit pixels 11 that are two-dimensionally arranged in a matrix form. The unit pixels 11 may be arranged in only a single row or column. The unit pixel 11 outputs a signal obtained through photoelectric conversion. The vertical scanning circuit 13 controls the outputs of the unit pixels 11 in units of rows. Signals output from each column of the unit pixels 11 are stored in the column circuit 14. The horizontal scanning circuit 15 sequentially reads out the signals that have been output from each column and stored in the column circuit 14 and outputs the read signals to the output circuit 16. The output circuit 16 is, for example, a differential amplification circuit.

FIG. 2A is a cross-sectional view of a photoelectric conversion unit disposed in the unit pixel 11. An N-type silicon semiconductor substrate 21, a P-type well layer 22, and N-type (first conductivity type) photoelectric conversion units 23 and 24 are provided. The first photoelectric conversion unit 23 and the second photoelectric conversion unit 24 are disposed on the N-type silicon semiconductor substrate 21 and accumulate charges. An element isolation film 25 and an isolation electrode 26 for providing the electrical connection/isolation between the photoelectric conversion units 23 and 24 are provided. The isolation electrode 26 is disposed on a region between the photoelectric conversion units 23 and 24 and controls the electrical conduction between the photoelectric conversion units 23 and 24. Under the isolation electrode 26, an N-type (first conductivity type) first region 27 that is continuous from the first photoelectric conversion unit 23 to the second photoelectric conversion unit 24 is disposed. Under the first region 27, a P-type (second conductivity type) second region 28 is formed.

The first region 27 is a first semiconductor region, is formed at a position that is under the isolation electrode 26 and between the photoelectric conversion units 23 and 24, and is continuous from the first photoelectric conversion unit 23 to the second photoelectric conversion unit 24. The second region 28 is a second semiconductor region, is formed at a position that is under the isolation electrode 26 and between the photoelectric conversion units 23 and 24, and is located at a depth different from that of the first region 27. The first region 27 is disposed on the side of the surface of the N-type silicon semiconductor substrate 21. The second region 28 is formed under the first region 27. The photoelectric conversion units 23 and 24 are disposed on the P-type well layer 22 that is a P-type (second conductivity type) region.

Figure 2B:
FIGS. 2B and 2C are diagrams illustrating the potential distributions of the photoelectric conversion unit.

FIG. 2B illustrates a potential distribution at a certain depth that is continuous from the first photoelectric conversion unit 23 to the second photoelectric conversion unit 24 when a positive voltage is applied to the isolation electrode 26 (ON state). In the drawing, Vpd represents a potential when the photoelectric conversion units 23 and 24 are completely depleted. In the state illustrated in FIG. 2B, electrons are accumulated on the surface of a substrate under the isolation electrode 26 and a channel is formed on the surface of the N-type first region 27. At that time, the potential of the first region 27 is derived from the Poisson's equation, that is, is determined in accordance with a voltage applied to the isolation electrode 26, the impurity concentration of the N-type first region 27, the impurity concentration of the P-type second region 28, and the intensity of an electric field applied to an oxide film under the isolation electrode 26. The N-type first region 27 is formed directly under the isolation electrode 26 and N-type impurities are continuous from the first photoelectric conversion unit 23 to the second photoelectric conversion unit 24. As a result, in a region extending from the first photoelectric conversion unit 23 to the second photoelectric conversion unit 24 through the first region 27, a potential distribution in which there is no potential barrier and Vpd is constant can be obtained. That is, the photoelectric conversion units 23 and 24 are connected. This state is hereinafter referred to as an ON operation.

Figure 2C:
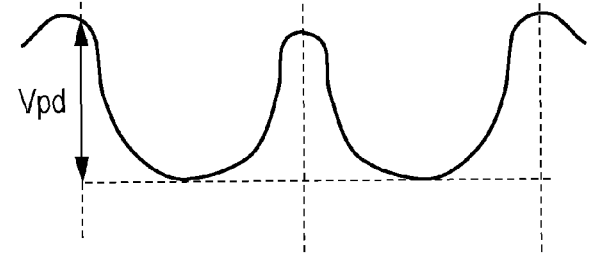

FIG. 2C illustrates the deepest potential distribution in a region that is continuous from the first photoelectric conversion unit 23 to the second photoelectric conversion unit 24 when a negative voltage is applied to the isolation electrode 26 (OFF state). In the drawing, Vpd represents a potential when the photoelectric conversion units 23 and 24 are completely depleted. In the state illustrated in FIG. 2C, on the surface of a substrate under the isolation electrode 26, positive holes are attracted toward the isolation electrode 26. At that time, the potential of the N-type first region 27 is derived from the Poisson's equation, that is, is determined in accordance with a voltage applied to the isolation electrode 26, the impurity concentration of the N-type first region 27, the impurity concentration of the P-type second region 28, and the intensity of an electric field applied to an oxide film under the isolation electrode 26. Since the P-type second region 28 with a high concentration is formed under the isolation electrode 26, many positive holes are supplied from the second region 28. A potential barrier is generated between the photoelectric conversion units 23 and 24 and the photoelectric conversion units 23 and 24 are isolated from each other. This state is hereinafter referred to as an OFF operation.

Within the range of a power supply voltage required to drive an image pickup apparatus, it is necessary to perform the ON operation and the OFF operation. Using the above-described configuration, the ON operation and the OFF operation can be performed at a lower voltage than before. For example, in a case where a drive power supply voltage for an image pickup apparatus is 5 V, the ON operation can be performed by applying approximately 2.5 V to the isolation electrode 26.

Figure 3:
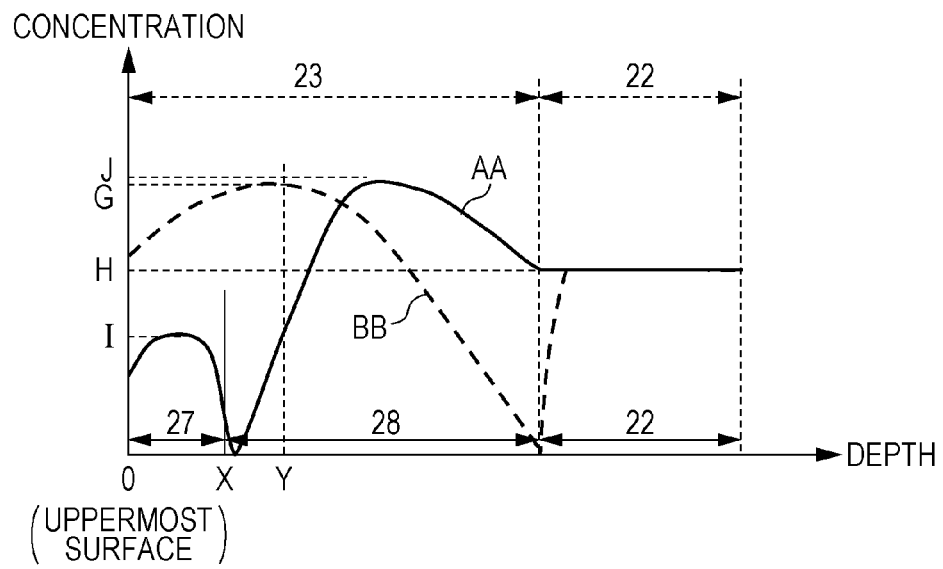
FIG. 3 is a diagram illustrating the cross-sectional concentration distribution of a photoelectric conversion unit.

FIG. 3 is a one-dimensional cut of impurity concentration distributions in the depth directions represented by line segments A-A and B-B in FIG. 2A. A solid line AA represents an impurity concentration at the line segment A-A under the center of the isolation electrode 26 in FIG. 2A. A dotted line BB represents an impurity concentration at the line segment B-B at the center of the first photoelectric conversion unit 23 in FIG. 2A. When the depth of the uppermost surface of the N-type silicon semiconductor substrate 21 is zero, a point X of the solid line AA in the depth direction represents the boundary between the N type and the P type. A point Y of the dotted line BB in the depth direction represents a depth at which the concentration peak of N-type impurities in the first photoelectric conversion unit 23 is provided. For example, X is 0.15 μm and Y is 0.3 μm.

The point X that is the boundary between the N-type first region 27 and the P-type second region 28 is located between the surface of the N-type silicon semiconductor substrate 21 and the point Y representing the depth at which the concentration peak of N-type impurities in the first photoelectric conversion unit 23 is provided. In this embodiment, in order to obtain the potential distributions illustrated in FIGS. 2B and 2C, the N-type first region 27 that is depleted at the time of the ON operation and the P-type second region 28 that supplies positive holes at the time of the OFF operation are located in a region shallower than the point Y of the dotted line BB in FIG. 3. As a result, for the above-described reasons, both the flat potential distribution (FIG. 2B) at the time of the ON operation of the isolation electrode 26 and the potential distribution (FIG. 2C) at the time of OFF operation for providing electrical isolation between the photoelectric conversion units 23 and 24 can be obtained. By forming a flat potential distribution under the isolation electrode 26 at the time of the ON operation of the isolation electrode 26, no charge remains between the photoelectric conversion units 23 and 24 and all charges can be read out to the column circuit 14.

At that time, the following exemplary impurity concentration relationship is obtained. An impurity concentration G of the photoelectric conversion units 23 and 24 is in the range of $1 \times 10^{16}$ to $1 \times 10^{18}$ [/cm$^3$]. An impurity concentration I of the N-type first region 27 is in the range of $1 \times 10^{13}$ to $1 \times 10^{15}$. An impurity concentration J of the P-type second region 28 is in the range of $1 \times 10^{16}$ to $1 \times 10^{13}$. An impurity concentration H of the P-type well layer 22 is in the range of $1 \times 10^{15}$ to $1 \times 10^{17}$.

Next, the effect of this embodiment will be described. In order to achieve complete charge transfer, a configuration with which a potential pocket or a potential barrier is generated under the isolation electrode 26 and charges remain should be avoided. Therefore, when a voltage is applied to the isolation electrode 26, a potential under the isolation electrode 26 needs to conform to the potential (depletion voltage) of the photoelectric conversion units (photodiodes) 23 and 24 on the left and right sides and be uniform.

Referring to Patent Document 1, N-type impurities are not implanted into an Si surface side under a gate electrode. In such a configuration, it is necessary to apply a high voltage exceeding a power supply voltage to a transfer electrode so as to make a potential under the transfer electrode conform to the potential of photodiodes on the left and right sides. When a voltage equal to or lower than a power supply voltage is applied, a potential barrier is generated and charges remain. This is impractical.

The detailed description thereof will be made. When a voltage is applied to the transfer electrode in Patent Document 1, positive hole charges are output from a region under the transfer electrode, the region is depleted, and negative space charges are generated. A potential is determined by the Poisson's equation. The increase in the voltage applied to the transfer electrode expands a depletion layer, increases the amount of space charge, and deepen a potential. That is, the width and depth of a transfer path are determined in accordance with a voltage applied to the transfer electrode.

It is assumed that N-type impurities are implanted into an Si surface side under the transfer electrode. In this case, when a voltage is applied to the transfer electrode, a region into which the N-type impurities have been implanted and a P-type layer side of a substrate in contact with the region are depleted and positive space charges and negative space charges are generated. A potential is determined by the Poisson's equation. The increase in the voltage applied to the gate electrode expands a depletion layer, increases the amount of space charge, and deepen a potential. This N-type impurity concentration can deepen the maximum potential. In this state in which both positive and negative charges are present, higher potential with respect to a voltage applied to the transfer electrode can be obtained under the transfer electrode as compared with a state in which only negative space charges are present.

In a case where a desired potential is obtained under the transfer electrode using a voltage within a power supply voltage, it is difficult to obtain a potential that conforms to the potential (depletion voltage) of photodiodes on the left and right sides of the region under the transfer electrode and is uniform without the implantation of N-type impurities into the region. When the potential is determined in the state in which only negative space charges are present as disclosed in Patent Document 1, a potential barrier is generated under the transfer electrode and charges remain as a result of the application of a voltage within a power supply voltage. As a result, complete charge transfer cannot be achieved.

According to this embodiment, at the time of application of a voltage to the isolation electrode 26, a potential under the isolation electrode 26 conforms to the potential (depletion voltage) of the photoelectric conversion units (photodiodes) 23 and 24 on the left and right sides of a region under the isolation electrode 26 and is uniform. As a result, no potential pocket or no potential barrier is generated under the isolation electrode 26, charges are prevented from remaining, and efficient charge transfer can be achieved.

In this embodiment, a lens for concentrating light on the photoelectric conversion units 23 and 24 may be disposed. In this case, focus detection is performed using a signal based on the charges of the first photoelectric conversion unit 23 and a signal based on the charges of the second photoelectric conversion unit 24. Since charges can be efficiently transferred, the accuracy of the focus detection can be increased.

(Second Embodiment)

Figure 4:
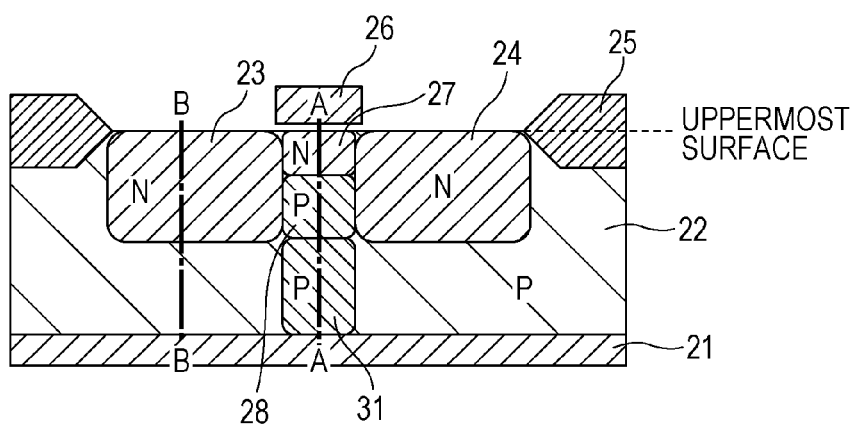
FIG. 4 is a cross-sectional view of a photoelectric conversion unit.

FIG. 4 is a cross-sectional view of a photoelectric conversion unit according to the second embodiment of the present invention in the unit pixel 11. Referring to the drawing, the same reference numerals are used to identify parts already described in the first embodiment. The same potential distributions at the time of the ON and OFF operations of the isolation electrode 26 as those in the first embodiment are obtained. This embodiment differs from the first embodiment in that a P-type (second conductivity type) mixture prevention layer 31 is formed under the second region 28. The mixture prevention layer 31 is formed at a position that is under the first region 27 and the second region 28 and deeper than the positions of the photoelectric conversion units 23 and 24.

Figure 5:
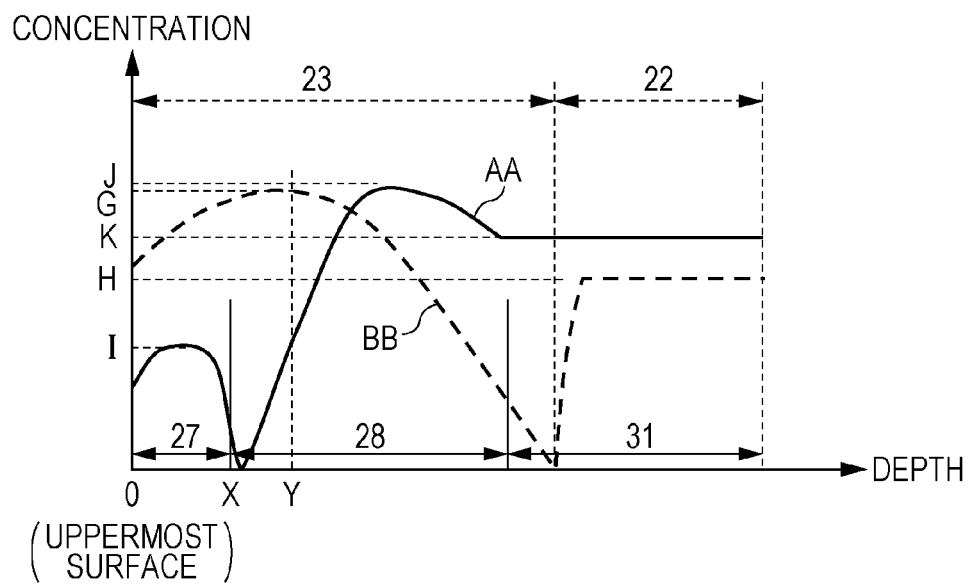
FIG. 5 is a diagram illustrating the cross-sectional concentration distribution of a photoelectric conversion unit.

FIG. 5 illustrates impurity concentration distributions in depth directions represented by line segments A-A and B-B in FIG. 4. A solid line AA represents an impurity concentration at the line segment A-A including the P-type mixture prevention layer 31. At the time of the OFF operation of the isolation electrode 26, the mixture of signal charges accumulated in the photoelectric conversion units 23 and 24 and charges generated in the P-type well layer 22 that is a P-type neutral region can be more reliably prevented. Various characteristic degradations of an image pickup apparatus caused by a pseudo signal generated by such mixture can be prevented. For example, in a case where a lens for concentrating light on the photoelectric conversion units 23 and 24 is disposed and the unit pixel 11 is employed as a distance-measuring pixel, the crosstalk of an automatic focusing (AF) signal can be avoided. More specifically, a signal based on the charges of the first photoelectric conversion unit 23 and a signal based on the charges of the second photoelectric conversion unit 24 are AF signals. For example, in a case where the unit pixel 11 is employed as a pixel in which signals from adjacent photoelectric conversion units in the vertical direction are added, the mixture of colors can be avoided. For example, in a case where an image pickup apparatus is employed as an electronic shutter, the leakage of signal charges during the accumulation of charges can be avoided.

Since an electric field generated from the isolation electrode 26 hardly reaches a deep portion of a semiconductor substrate, the mixture prevention layer 31 can easily generate a potential barrier. At that time, an impurity concentration K of the P-type mixture prevention layer 31 is preferably in the range of, for example, $1\times10^{16}$ to $1\times10^{18}$.

(Third Embodiment)

Figure 6:
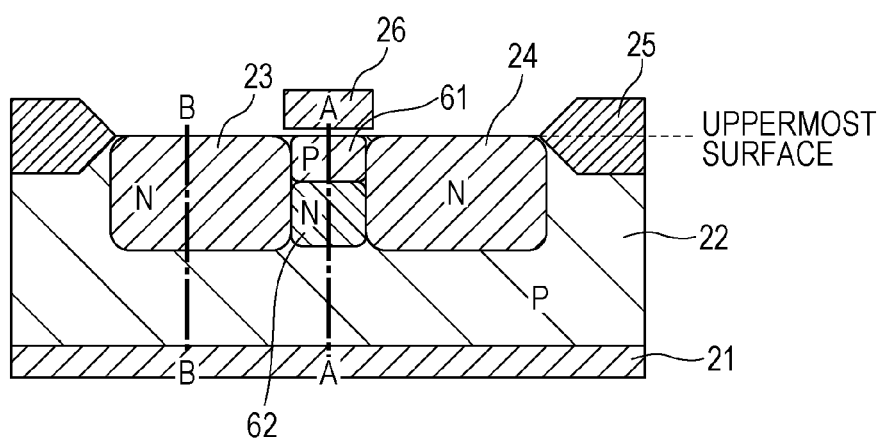
FIG. 6 is a cross-sectional view of a photoelectric conversion unit.

FIG. 6 is a cross-sectional view of a photoelectric conversion unit according to the third embodiment of the present invention in the unit pixel 11. Referring to the drawing, the same reference numerals are used to identify parts already described in the first embodiment. The same potential distributions at the time of the ON and OFF operations of the isolation electrode 26 as those in the first embodiment are obtained. This embodiment differs from the first embodiment in that a P-type second region 61 is formed under the isolation electrode 26 and an N-type first region 62 is formed under the second region 61. The second region 61 is a second semiconductor region and is formed on the side of the surface of the N-type silicon semiconductor substrate 21. The first region 62 is a first semiconductor region and is formed under the second region 61.

Figure 7:
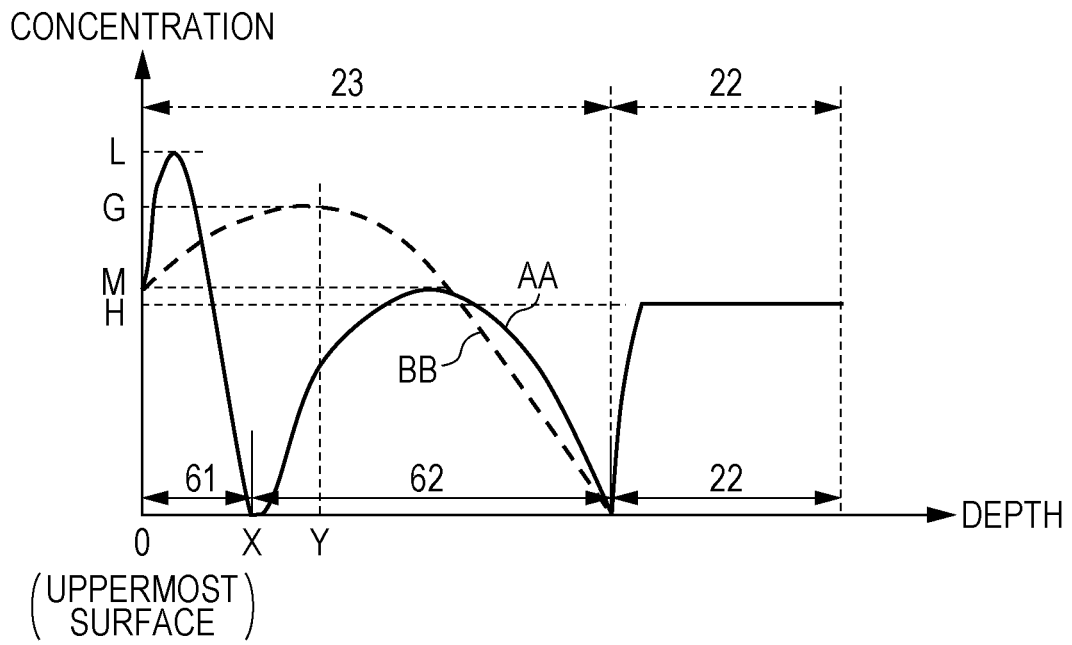
FIG. 7 is a diagram illustrating the cross-sectional concentration distribution of a photoelectric conversion unit.

FIG. 7 illustrates impurity concentration distributions in depth directions represented by line segments A-A and B-B in FIG. 6. An impurity concentration M of the N-type first region 62 is preferably in the range of $1\times10^{15}$ to $1\times10^{17}$. An impurity concentration L of the P-type second region 61 is preferably in the range of $1\times10^{17}$ to $1\times10^{19}$. At the time of the ON operation of the isolation electrode 26, a position at which the deepest potential is obtained is further from the surface of a substrate as compared with the first embodiment, and can be easily connected to the potential deepest part extending from the first photoelectric conversion unit 23 to the second photoelectric conversion unit 24.

At the time of the OFF operation of the isolation electrode 26, positive holes are supplied from the second region 61 located directly under the isolation electrode 26 to the isolation electrode 26. Thus, the isolation electrode 26 can perform OFF operation. In a configuration according to this embodiment, the ON operation is more easily performed and the OFF operation is less easily performed as compared with the first embodiment.

(Fourth Embodiment)

Figure 8:
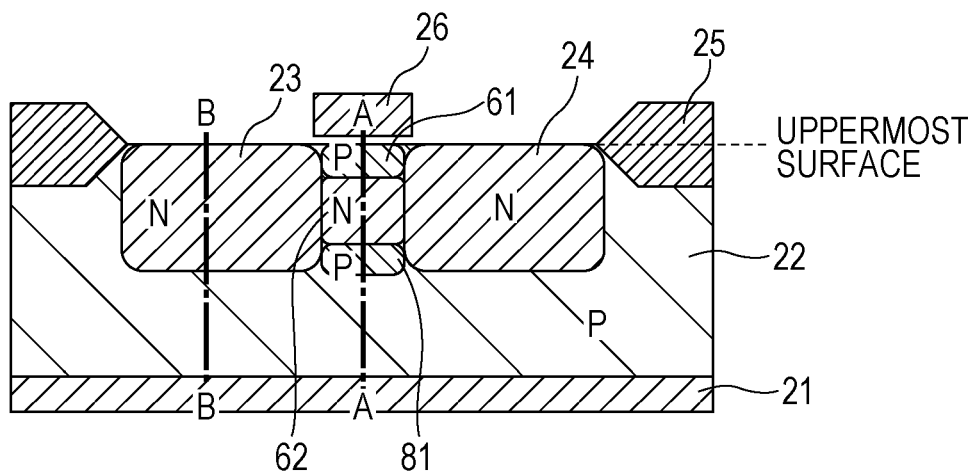
FIG. 8 is a cross-sectional view of a photoelectric conversion unit.

FIG. 8 is a cross-sectional view of a photoelectric conversion unit according to the fourth embodiment of the present invention in the unit pixel 11. Referring to the drawing, the same reference numerals are used to identify parts already described in the third embodiment. The same potential distributions at the time of the ON and OFF operations of the isolation electrode 26 as those in the first embodiment are obtained. This embodiment differs from the third embodiment in that a P-type (second conductivity type) implantation layer 81 is formed under the N-type first region 62.

Figure 9:
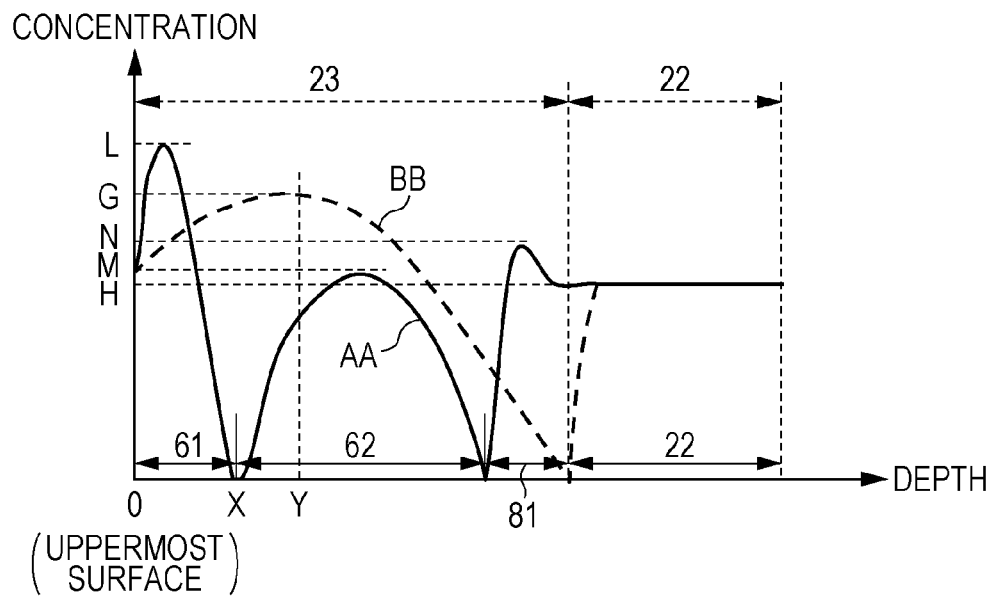
FIG. 9 is a diagram illustrating the cross-sectional concentration distribution of a photoelectric conversion unit.

FIG. 9 illustrates impurity concentration distributions in depth directions represented by line segments A-A and B-B in FIG. 8. An impurity concentration N of the P-type implantation layer 81 is preferably in the range of $1\times10^{16}$ to $1\times10^{19}$. In this embodiment, at the time of the ON operation, the potential deepest part extending from the first photoelectric conversion unit 23 to the second photoelectric conversion unit 24 becomes thinner as compared with the third embodiment. However, in this embodiment, at the time of OFF operation, positive holes are supplied from the second region 61 and the P-type implantation layer 81. Accordingly, even though a negative voltage is increased, the OFF operation can be performed. The mixture of signals charges accumulated in the photoelectric conversion units 23 and 24 can be more reliably prevented.

(Fifth Embodiment)

Figure 10:
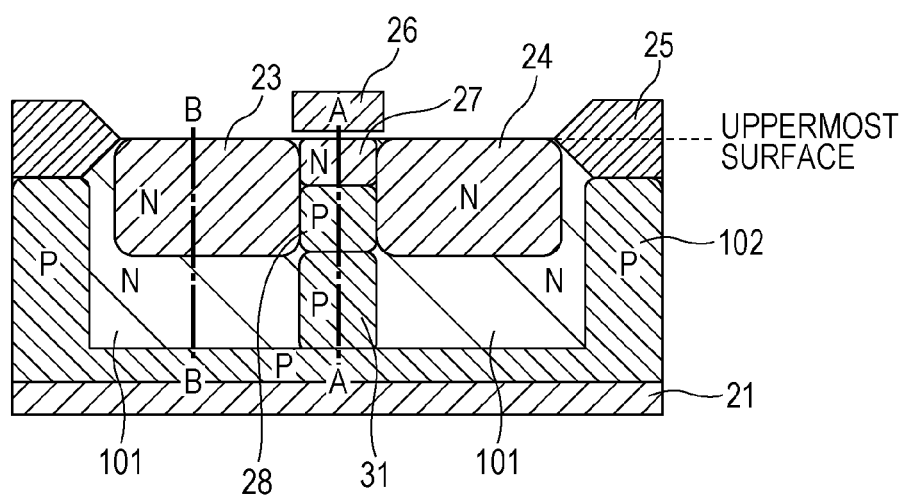
FIG. 10 is a cross-sectional view of a photoelectric conversion unit.

FIG. 10 is a cross-sectional view of a photoelectric conversion unit according to the fifth embodiment of the present invention in the unit pixel 11. Referring to the drawing, the same reference numerals are used to identify parts already described in the second embodiment. The same potential distributions at the time of the ON and OFF operations of the isolation electrode 26 as those in the first embodiment are obtained. This embodiment differs from the second embodiment in that an N-type epitaxial layer 101 is formed instead of the P-type well layer 22 and a P-type isolation layer 102 surrounding the unit pixel 11 is formed. The photoelectric conversion units 23 and 24 are disposed on the N-type epitaxial layer 101 that is an N-type (first conductivity type) region.

Figure 11:
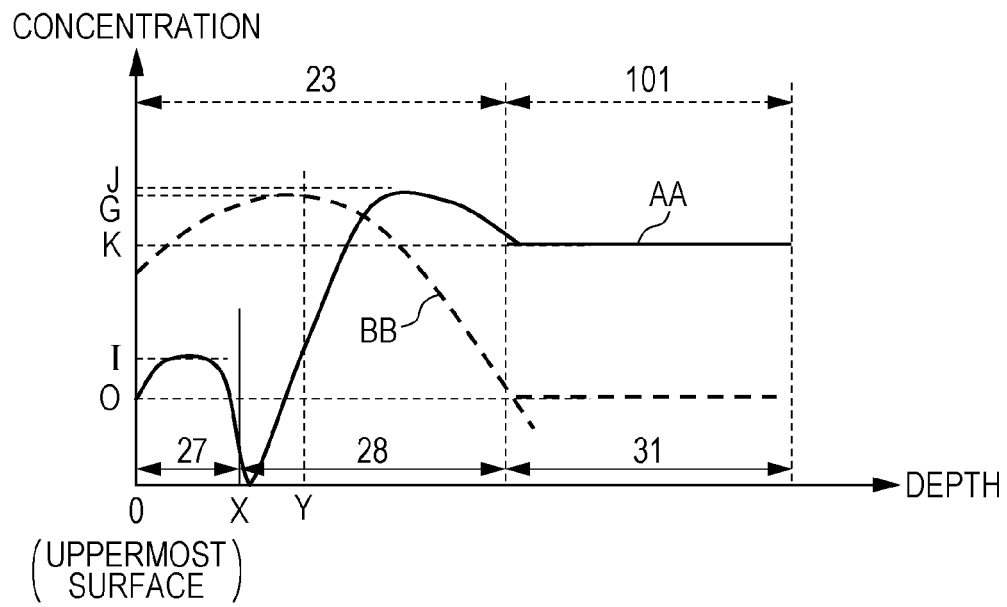
FIG. 11 is a diagram illustrating the cross-sectional concentration distribution of a photoelectric conversion unit.

FIG. 11 illustrates impurity concentration distributions in depth directions represented by line segments A-A and B-B in FIG. 10. An impurity concentration O of the N-type epitaxial layer 101 is preferably in the range of $1\times10^{13}$ to $1\times10^{14}$. In this embodiment, the N-type epitaxial layer 101 increases the width of a depletion layer for the photoelectric conversion units 23 and 24. The photoelectric conversion units 23 and 24 can accumulate a larger amount of charges as compared with the second embodiment. The P-type isolation layer 102 can prevent charges generated in the unit pixel 11 from leaking to an adjacent pixel or a somewhere on the side of a substrate.

(Sixth Embodiment)

Figure 12:
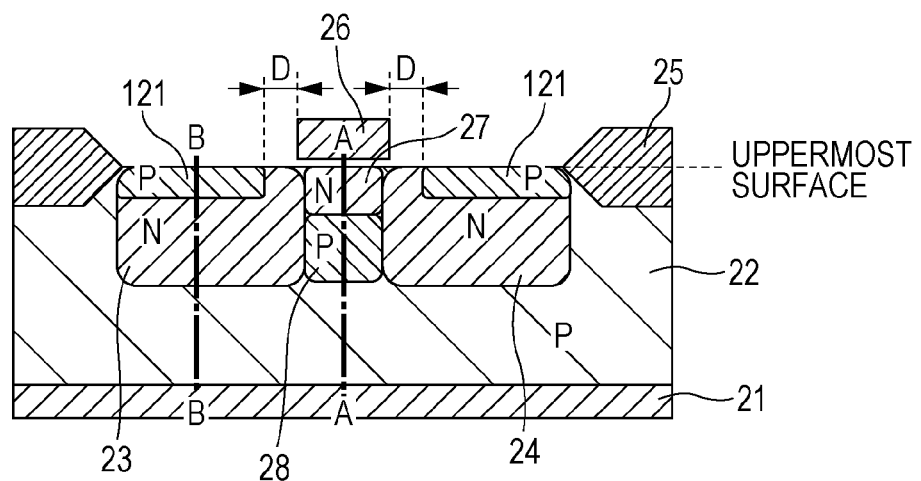
FIG. 12 is a cross-sectional view of a photoelectric conversion unit.

FIG. 12 is a cross-sectional view of a photoelectric conversion unit according to the sixth embodiment of the present invention in the unit pixel 11. Referring to the drawing, the same reference numerals are used to identify parts already described in the first embodiment. The same potential distributions at the time of the ON and OFF operations of the isolation electrode 26 as those in the first embodiment are obtained. This embodiment differs from the first embodiment in that P-type (second conductivity type) surface shield layers 121 are formed on the surfaces of the photoelectric conversion units 23 and 24. The end portion of the surface shield layer 121 is apart from the end portion of the isolation electrode 26 by a predetermined distance D. The distance D is preferably, for example, approximately 0.2 μm. One of the surface shield layers 121 is formed on the surface of the first photoelectric conversion unit 23 and is not formed under the isolation electrode 26. The other one of the surface shield layers 121 is formed on the surface of the second photoelectric conversion unit 24 and is not formed under the isolation electrode 26.

Figure 13:
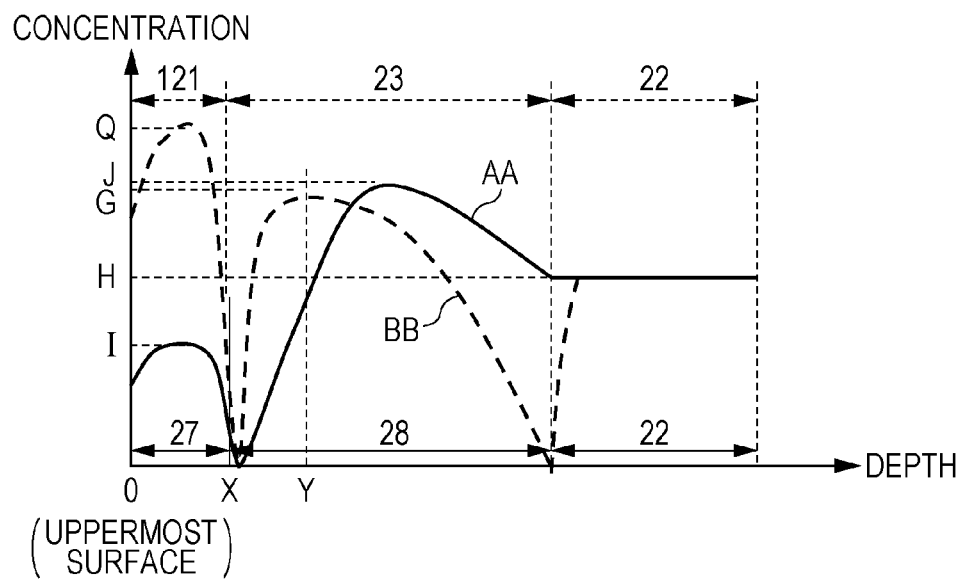
FIG. 13 is a diagram illustrating the cross-sectional concentration distribution of a photoelectric conversion unit.

FIG. 13 illustrates impurity concentration distributions in depth directions represented by line segments A-A and B-B in FIG. 12. An impurity concentration Q of the surface shield layer 121 is preferably in the range of $1\times10^{18}$ to $1\times10^{19}$. The P-type surface shield layer 121 covers the surface potentials of the photoelectric conversion units 23 and 24 with highly-concentrated positive holes and inactivates the surface potentials. As a result, the generation of a dark current can be prevented. It is necessary to place the surface shield layer 121 apart from the isolation electrode 26 so that the impurity concentration distribution of the surface shield layer 121 does not affect the potential distribution of the N-type first region 27. The distance between the end portion of the isolation electrode 26 and the end portion of the surface shield layer 121 corresponds to the distance D in FIG. 12. As a result, at the time of the ON operation of the isolation electrode 26, the flat potential distribution under the isolation electrode 26 is not damaged.

(Seventh Embodiment)

Figure 14:
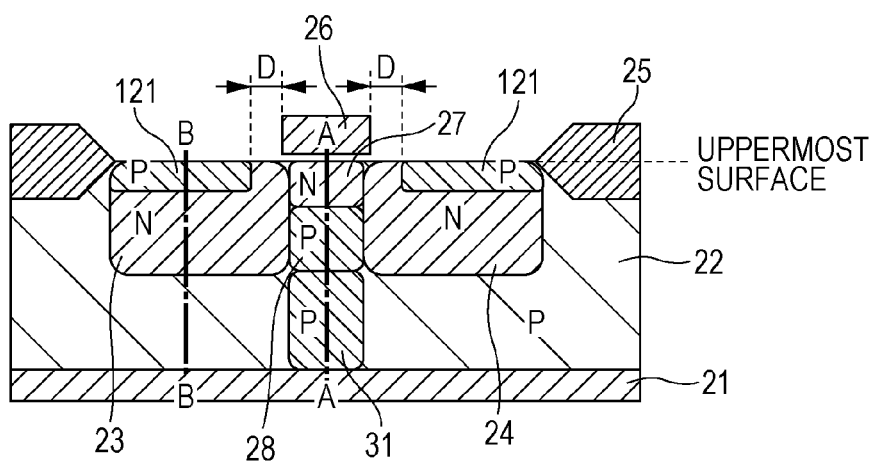
FIG. 14 is a cross-sectional view of a photoelectric conversion unit.

FIG. 14 is a cross-sectional view of a photoelectric conversion unit according to the seventh embodiment of the present invention in the unit pixel 11. Referring to the drawing, the same reference numerals are used to identify parts already described in the sixth embodiment. The same potential distributions at the time of the ON and OFF operations of the isolation electrode 26 as those in the first embodiment are obtained. This embodiment differs from the sixth embodiment in that the P-type (second conductivity type) mixture prevention layer 31 is formed under the P-type second region 28.

The mixture prevention layer 31 is formed at a position that is under the first region 27 and the second region 28 and deeper than the positions of the photoelectric conversion units 23 and 24. The first region 27 is formed on the side of the surface of the N-type silicon semiconductor substrate 21. The second region 28 is formed under the first region 27. The mixture prevention layer 31 is formed under the second region 28.

Figure 15:
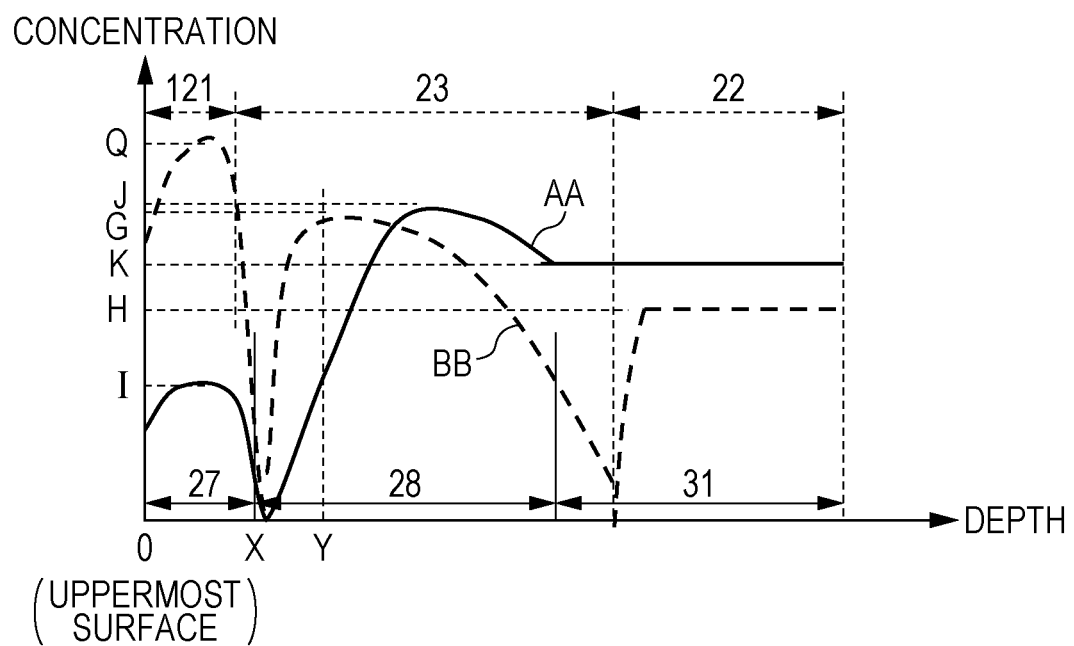
FIG. 15 is a diagram illustrating the cross-sectional concentration distribution of a photoelectric conversion unit.

FIG. 15 illustrates impurity concentration distributions in depth directions represented by line segments A-A and B-B in FIG. 14. This embodiment has a characteristics in the relationship of peak impurity concentration among the P-type second region 28, the mixture prevention layer 31, and the surface shield layer 121. That is, the peak impurity concentration of the P-type second region 28 is lower than that of the surface shield layer 121 and is higher than that of the mixture prevention layer 31. At the time of the OFF operation of the isolation electrode 26, the P-type second region 28 functions as a positive hole supply source and contributes to the determination of a path at the time of the ON operation. If the impurity concentration of the P-type second region 28 is too high, this path is blocked. Accordingly, the peak impurity concentration of the P-type second region 28 needs to be lower than that of the surface shield layer 121. Without inhibiting the formation of a flat potential distribution under the isolation electrode 26 at the time of the ON operation of the isolation electrode 26, the electrical isolation between the photoelectric conversion units 23 and 24 can also be achieved at the time of the OFF operation of the isolation electrode 26. Since the mixture prevention layer 31 can cause the P-type second region 28 to more reliably function as a positive hole supply source at the time of the OFF operation of the isolation electrode 26, a voltage applied at the time of the ON operation of the isolation electrode 26 can be reduced.

(Eighth Embodiment)

Figure 16A:
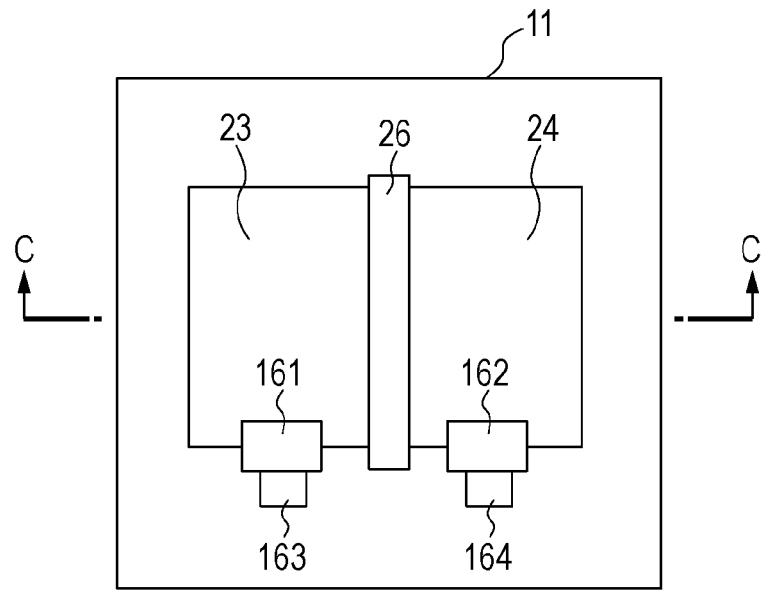
FIGS. 16A and 16B are plan views of a photoelectric conversion unit.
Figure 16B:
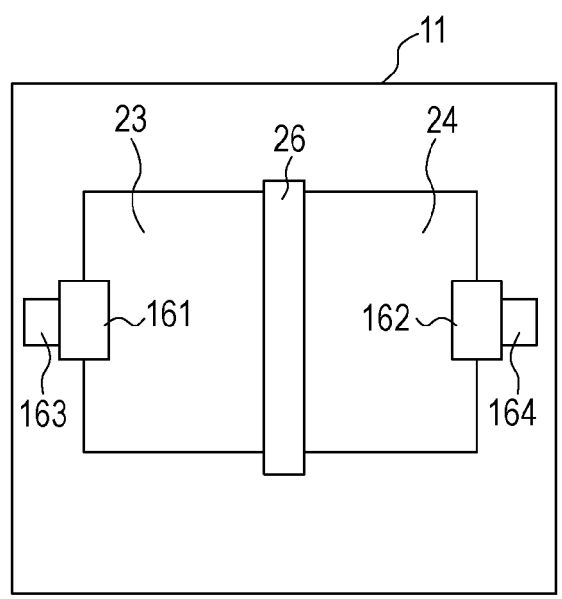

FIGS. 16A and 16B are diagrams illustrating exemplary configurations of the unit pixel 11 according to the eighth embodiment of the present invention, and are plan views illustrating examples of the unit pixel 11 according to the first to seventh embodiments. Referring to the drawing, the same reference numerals are used to identify functions and parts already described in the first embodiment. The unit pixel 11 includes the photoelectric conversion units 23 and 24. The isolation electrode 26, a first floating diffusion unit (FD unit) 163, a second FD unit 164, a first transfer electrode 161, and a second transfer electrode 162. A single microlens is preferably provided for each unit pixel 11. The cross-sectional views in the first to seventh embodiments correspond to a view taken along a line C-C in the plan view of FIG. 16A. Light input into the unit pixel 11 is transmitted to the photoelectric conversion units 23 and 24 via a microlens. Each of the photoelectric conversion units 23 and 24 converts the light into electrons and accumulates the electrons.

The unit pixel 11 may be used as a distance-measuring pixel formed with the photoelectric conversion units 23 and 24. A subject image is formed on the image capturing unit 12 illustrated in FIG. 1 by an image pickup optical system including an image capturing lens. The image capturing unit 12 includes the distance-measuring unit pixel 11 and assigns a direction in which the photoelectric conversion units 23 and 24 in the unit pixel 11 as a pupil division direction. Light beam passes through one of divided pupil regions, is received by the first photoelectric conversion unit 23, and is then generated as a subject image. A signal of the subject image is hereinafter referred to as an image A signal. Light beam passes through the other one of divided pupil regions, is received by the second photoelectric conversion unit 24, and is then generated as a subject image. A signal of the subject image is hereinafter referred to as an image B signal. The information on the image A signal and the information on the image B signal are transferred to a computation unit via the column circuit 14 and the output circuit 16. The computation unit can calculate distance information on a subject on the basis of a gap length between the image A signal and the image B signal and a base length.

At that time, the isolation electrode 26 performs the OFF operation, a positive voltage is applied to the first transfer electrode 161, and the image A signal stored in the first photoelectric conversion unit 23 is transferred to the first FD unit 163. At the same time, a positive voltage is applied to the second transfer electrode 162 and the image B signal stored in the second photoelectric conversion unit 24 is transferred to the second FD unit 164.

In another method, a positive voltage is applied only to the first transfer electrode 161, the isolation electrode 26 performs the OFF operation, and the image A signal stored in the first photoelectric conversion unit 23 is transferred to the first FD unit 163. Subsequently, a positive voltage is applied to the isolation electrode 26 so as to cause the isolation electrode 26 to perform the ON operation and the image B signal stored in the second photoelectric conversion unit 24 is transferred to the first FD unit 163 via the first photoelectric conversion unit 23.

The ON operation and the OFF operation of the isolation electrode 26 correspond to the ON operation and the OFF operation according to the first to seventh embodiments, respectively. When the unit pixel 11 is employed as a distance detection pixel, the characteristic of a crosstalk between the photoelectric conversion units 23 and 24 can be freely changed by adjusting a voltage applied to the isolation electrode 26 at the time of the OFF operation.

Thus, each of the first FD unit 163 and the second FD unit 164 accumulates charges. The first transfer electrode 161 transfers charges accumulated in the first photoelectric conversion unit 23 to the first FD unit 163. The second transfer electrode 162 transfers charges accumulated in the second photoelectric conversion unit 24 to the second FD unit 164.

First, the isolation electrode 26 brings the first photoelectric conversion unit 23 and the second photoelectric conversion unit 24 into a non-conductive state and the first transfer electrode 161 transfers charges accumulated in the first photoelectric conversion unit 23 to the first FD unit 163.

Subsequently, the isolation electrode 26 brings the first photoelectric conversion unit 23 and the second photoelectric conversion unit 24 into a conductive state and the first transfer electrode 161 transfers charges accumulated in the second photoelectric conversion unit 24 to the first FD unit 163 via the first photoelectric conversion unit 23.

(Ninth Embodiment)

Figure 17:
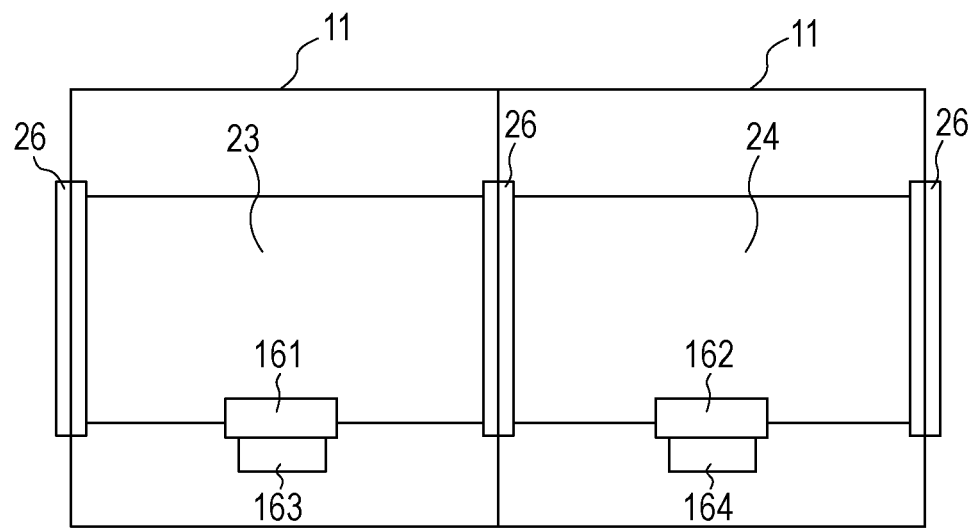
FIG. 17 is a plan view of a photoelectric conversion unit.

FIG. 17 is a diagram illustrating an exemplary configuration of the unit pixel 11 according to the ninth embodiment of the present invention, and is a plan view illustrating an example of the unit pixel 11 according to the first to seventh embodiments. This embodiment differs from the eighth embodiment in that a single photoelectric conversion unit is provided for each unit pixel 11. One of the unit pixels 11 includes the photoelectric conversion unit 23, the transfer electrode 161, and the FD unit 163. The other one of the unit pixels 11 includes the photoelectric conversion unit 24, the transfer electrode 162, and the FD unit 164. The unit pixel 11 does not necessarily have to include a microlens. In this embodiment, charges accumulated in the photoelectric conversion units 23 and 24 that are adjacent to each other in the vertical or horizontal direction can be added. For example, when the photoelectric conversion units 23 and 24 are arranged in the vertical direction, a progressive operation of reading out lines one by one and an interlaced operation of adding two lines and reading out a result of the addition can be performed.

At the time of the progressive operation, the isolation electrode 26 performs the OFF operation, a positive voltage is applied to the transfer electrode 161, and the image A signal stored in the photoelectric conversion unit 23 is transferred to the FD unit 163. At the same time, a positive voltage is applied to the transfer electrode 162 and the image B signal stored in the photoelectric conversion unit 24 is transferred to the FD unit 164.

At the time of the interlaced operation, a positive voltage is applied to the isolation electrode 26 so as to cause the isolation electrode 26 to operate the ON operation, the image A signal stored in the photoelectric conversion unit 23 and the image B signal stored in the photoelectric conversion unit 24 are added, a positive voltage is applied only to the transfer electrode 161, and a signal obtained by the addition is transferred to the FD unit 163. The ON operation and the OFF operation of the isolation electrode 26 correspond to the ON operation and the OFF operation according to the first to seventh embodiments, respectively.

As described previously, in the progressive operation (a first mode), the isolation electrode 26 brings the first photoelectric conversion unit 23 and the second photoelectric conversion unit 24 into a non-conductive state. In this state, the first transfer electrode 161 transfers charges accumulated in the first photoelectric conversion unit 23 to the first FD unit 163 and the second transfer electrode 162 transfers charges accumulated in the second photoelectric conversion unit 24 to the second FD unit 164.

In the interlaced operation (a second mode), the isolation electrode 26 brings the first photoelectric conversion unit 23 and the second photoelectric conversion unit 24 into a conductive state. In this state, the first transfer electrode 161 transfers charges accumulated in the first photoelectric conversion unit 23 and charges accumulated in the second photoelectric conversion unit 24 to the first FD unit 163.

(Tenth Embodiment)

Figure 18:
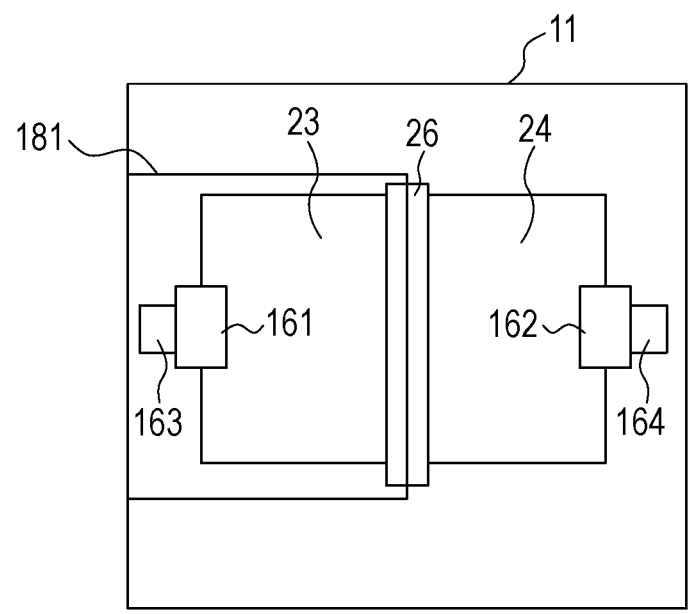
FIG. 18 is a plan view of a photoelectric conversion unit.

FIG. 18 is a diagram illustrating an exemplary configuration of the unit pixel 11 according to the tenth embodiment of the present invention, and is a plan view illustrating an example of the unit pixel 11 according to the first to seventh embodiments. This embodiment differs from the eighth embodiment in that the top portion of the first photoelectric conversion unit 23 is covered with a light-shielding layer 181. The light-shielding layer 181 may cover not only the first photoelectric conversion unit 23 but also the first transfer electrode 161 and the first FD unit 163. The unit pixel 11 does not necessarily have to include a microlens. This embodiment is suitable for use in an electronic shutter. In a case where this embodiment is applied to an electronic shutter, in all photoelectric conversion units in the unit pixels 11 arranged in the image capturing unit 12, the accumulation of charges is simultaneously started. The transfer of charges to an adjacent accumulation unit (photoelectric conversion unit) is simultaneously performed and the accumulation of charges ends. More specifically, light that has entered only the second photoelectric conversion unit 24 is converted into electrons and are accumulated in the second photoelectric conversion unit 24. A signal stored in the second photoelectric conversion unit 24 is transferred to the shielded photoelectric conversion unit 23 after the isolation electrode 26 has performed the ON operation, so that the accumulation ends. Subsequently, a positive voltage is applied only to the first transfer electrode 161, the isolation electrode 26 performs the OFF operation, and a signal stored in the first photoelectric conversion unit 23 is transferred to the first FD unit 163. The ON operation and the OFF operation of the isolation electrode 26 correspond to the ON operation and the OFF operation according to the first to seventh embodiments, respectively.

As described previously, the light-shielding layer 181 blocks light from reaching the first photoelectric conversion unit 23. First, the isolation electrode 26 brings the first photoelectric conversion unit 23 and the second photoelectric conversion unit 24 into a conductive state and transfers charges accumulated in the second photoelectric conversion unit 24 to the first photoelectric conversion unit 23.

Subsequently, the isolation electrode 26 brings the first photoelectric conversion unit 23 and the second photoelectric conversion unit 24 into a non-conductive state and the first transfer electrode 161 transfers charges accumulated in the first photoelectric conversion unit 23 to the first FD unit 163.

(Eleventh Embodiment)

Figure 19A:
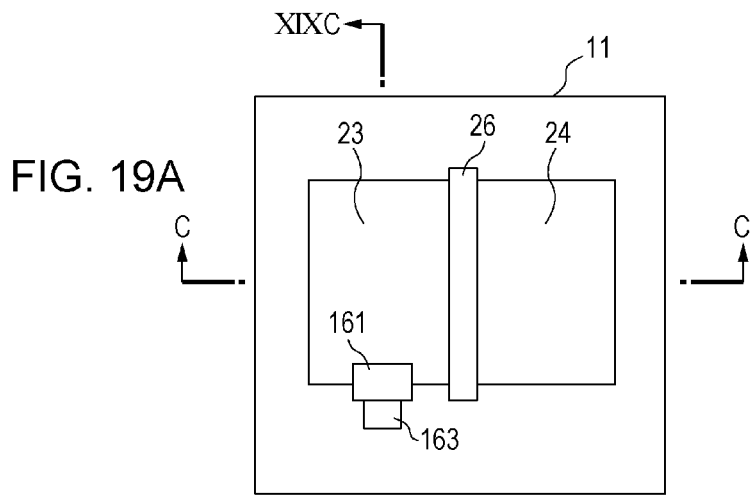
FIGS. 19A and 19B are plan views of a photoelectric conversion unit.
Figure 19B:
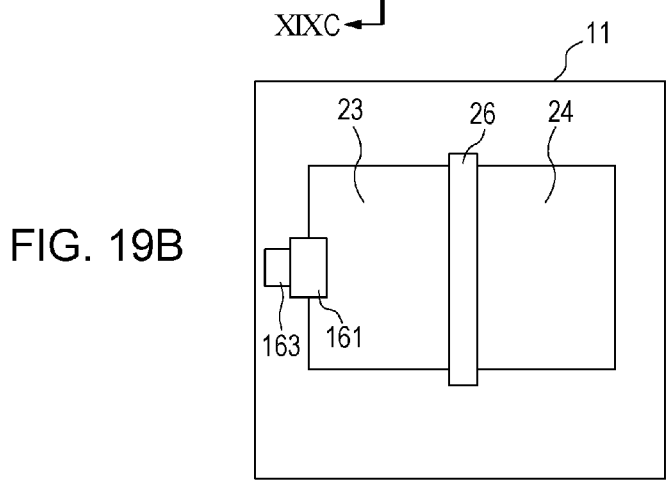

FIGS. 19A and 19B are diagrams illustrating exemplary configurations of the unit pixel 11 according to the eleventh embodiment of the present invention, and are plan views illustrating examples of the unit pixel 11 according to the first to seventh embodiments. This embodiment differs from the eighth embodiment in that the transfer electrode 162 and the FD unit 164 are eliminated. In such a configuration according to this embodiment, driving similar to those according to the eighth to tenth embodiments can be achieved using the isolation electrode 26, the transfer electrode 161, and the FD unit 163. Since the transfer electrode 162 and the FD unit 164 are eliminated in this embodiment, the photoelectric conversion units 23 and 24 can have larger areas.

Figure 19C:
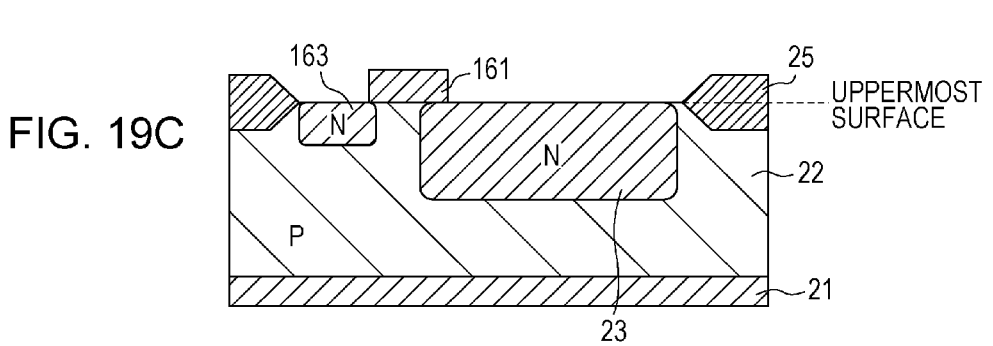
FIG. 19C is a cross-sectional view of a photoelectric conversion unit.

FIG. 19C is a cross-sectional view taken along a line XIXC-XIXC in the unit pixel 11 in FIG. 19A. The cross-sectional views in the first to seventh embodiments (FIGS. 2A to 2C, 4, 6, 8, 10, 12, and 14) corresponds to a view taken along a line C-C in the plan view of FIG. 19A.

A driving method according to this embodiment is the same as, for example, that according to the eighth embodiment. A negative voltage is applied to the isolation electrode 26 so as to cause the isolation electrode 26 to perform the OFF operation, and a positive voltage is applied to the transfer electrode 161 so as to cause the transfer electrode 161 to transfer the image A signal stored in the photoelectric conversion unit 23 to the FD unit 163. Subsequently, a positive voltage is applied to the isolation electrode 26 so as to cause the isolation electrode 26 to perform the ON operation, and the image B signal stored in the photoelectric conversion unit 24 is transferred to the FD unit 163 via the photoelectric conversion unit 23. At that time, the impurity concentration of the first region 27 illustrated in the cross-sectional views in the first to seventh embodiments is lower than that of the FD unit 163. The first FD unit 163 is an N-type (first conductivity type) region. The peak impurity concentration of the first region 27 is lower than that of the first FD unit 163.

The transfer of a signal from the second photoelectric conversion unit 24 to the first photoelectric conversion unit 23 does not necessarily have to be performed on a substrate surface. The reason for this is that the deepest potential point of the photoelectric conversion unit 24 and 23 is located at a deep position. On the other hand, it is necessary to perform the transfer of a signal from the photoelectric conversion unit 23 to the FD unit 163 on the substrate surface. The reason for this is that the FD unit 163 is formed on the surface. Different designs are needed for these transfers.

(Twelfth Embodiment)

FIG. 20A is a cross-sectional view of a photoelectric conversion unit according to the twelfth embodiment of the present invention in the unit pixel 11. Referring to the drawing, the same reference numerals are used to identify parts already described in the first embodiment. This embodiment differs from the first embodiment in that the impurity concentration of the second photoelectric conversion unit 24 is lower than that of the first photoelectric conversion unit 23.

FIG. 21 illustrates impurity concentration distributions in depth directions represented by line segments B-B and F-F in FIG. 20A. An impurity concentration G of the first photoelectric conversion unit 23 is preferably in the range of $1 \times 10^{16}$ to $1 \times 10^{18}$ [/cm$^3$] and an impurity concentration R of the second photoelectric conversion unit 24 is preferably in the range of $0.8 \times 10^{16}$ to $0.8 \times 10^{18}$ [/cm$^3$].

FIG. 20B illustrates a potential at the time of the ON operation of applying a positive voltage to the isolation electrode 26. FIG. 20C illustrates a potential at the time of the OFF operation of applying a negative voltage to the isolation electrode 26. In the drawing, Vpda represents a potential when the first photoelectric conversion unit 23 is completely depleted and Vpdb represents a potential when the second photoelectric conversion unit 24 is completely depleted. The relationship of Vpda>Vpdb is obtained on the basis of the above-described impurity concentration relationship.

In a case where a configuration according to this embodiment is applied to a distance-measuring pixel, the following transfer procedure is preferably performed. That is, a negative voltage is applied to the isolation electrode 26 so as to cause the isolation electrode 26 to perform the OFF operation, and a positive voltage is applied to the transfer electrode 161 so as to cause the transfer electrode 161 to transfer the image A signal stored in the photoelectric conversion unit 23 to the FD unit 163. Subsequently, a positive voltage is applied to the isolation electrode 26 so as to cause the isolation electrode 26 to perform the ON operation, and the image B signal stored in the photoelectric conversion unit 24 is transferred to the FD unit 163 via the photoelectric conversion unit 23. Since the potential of the first photoelectric conversion unit 23 is deeper than that of the second photoelectric conversion unit 24, an electric field is generated at a boundary between the photoelectric conversion units 23 and 24 and the transfer of a signal from the second photoelectric conversion unit 24 to the first photoelectric conversion unit 23 can therefore be more easily performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-101472, filed May 15, 2014, which is hereby incorporated by reference herein in its entirety.

What is claimed is:

1. An image pickup apparatus comprising:
    a semiconductor substrate;
    a first photoelectric conversion unit that is disposed in the semiconductor substrate, is configured to accumulate charges, and is of a first conductivity type;
    a second photoelectric conversion unit that is disposed in the semiconductor substrate, is configured to accumulate charges, and is of the first conductivity type;
    an electrode that is disposed on a region between the first photoelectric conversion unit and the second photoelectric conversion unit and is configured to control an electrical conduction between the first photoelectric conversion unit and the second photoelectric conversion unit;
    a first semiconductor region that is disposed under the electrode and between the first photoelectric conversion unit and the second photoelectric conversion unit, is continuous from the first photoelectric conversion unit to the second photoelectric conversion unit, and is of the first conductivity type; and
    a second semiconductor region that is disposed under the electrode and between the first photoelectric conversion unit and the second photoelectric conversion unit, is provided at a depth different from that of the first semiconductor region, and is of a second conductivity type,
    wherein a boundary between the first semiconductor region and the second semiconductor region is located between a surface of the semiconductor substrate and a depth at which an impurity concentration peak of the first photoelectric conversion unit is provided.

2. The image pickup apparatus according to claim 1, further comprising a mixture prevention layer that is of the second conductivity type and is formed at a position that is under the first semiconductor region and the second semiconductor region and deeper than positions of the first photoelectric conversion unit and the second photoelectric conversion unit.

3. The image pickup apparatus according to claim 1, wherein the first semiconductor region is formed on a side of the surface of the semiconductor substrate, and wherein the second semiconductor region is formed under the first semiconductor region.

4. The image pickup apparatus according to claim 1, wherein the second semiconductor region is formed on a side of the surface of the semiconductor substrate, and wherein the first semiconductor region is formed under the second semiconductor region.

5. The image pickup apparatus according to claim 4, further comprising an implantation layer of the second conductivity type formed under the first semiconductor region.

6. The image pickup apparatus according to claim 2, wherein the first photoelectric conversion unit and the second photoelectric conversion unit are disposed on a region of the first conductivity type.

7. The image pickup apparatus according to claim 1, wherein the first photoelectric conversion unit and the second photoelectric conversion unit are disposed on a region of the second conductivity type.

8. The image pickup apparatus according to claim 1, further comprising:
    a first surface shield layer that is formed on a surface of the first photoelectric conversion unit, is not formed under the electrode, and is of the second conductivity type; and
    a second surface shield layer that is formed on a surface of the second photoelectric conversion unit, is not formed under the electrode, and is of the second conductivity type.

9. The image pickup apparatus according to claim 8, further comprising a mixture prevention layer of the second conductivity type formed at a position that is under the first semiconductor region and the second semiconductor region and deeper than positions of the first photoelectric conversion unit and the second photoelectric conversion unit, wherein the first semiconductor region is formed on a side of the surface of the semiconductor substrate, wherein the second semiconductor region is formed under the first semiconductor region, wherein the mixture prevention layer is formed under the second semiconductor region, and wherein a peak impurity concentration of the second semiconductor region is lower than that of the first surface shield layer and is higher than that of the mixture prevention layer.

10. The image pickup apparatus according to claim 1, further comprising:
   a first floating diffusion unit configured to accumulate charges; and
   a first transfer electrode configured to transfer charges accumulated in the first photoelectric conversion unit to the first floating diffusion unit,
   wherein the electrode brings the first photoelectric conversion unit and the second photoelectric conversion unit into a non-conductive state and the first transfer electrode transfers charges accumulated in the first photoelectric conversion unit to the first floating diffusion unit, and
   wherein, after that, the electrode brings the first photoelectric conversion unit and the second photoelectric conversion unit into a conductive state and the first transfer electrode transfers charges accumulated in the second photoelectric conversion unit to the first floating diffusion unit via the first photoelectric conversion unit.

11. The image pickup apparatus according to claim 1, further comprising:
   a first floating diffusion unit configured to accumulate charges;
   a first transfer electrode configured to transfer charges accumulated in the first photoelectric conversion unit to the first floating diffusion unit;
   a second floating diffusion unit configured to accumulate charges; and
   a second transfer electrode configured to transfer charges accumulated in the second photoelectric conversion unit to the second floating diffusion unit,
   wherein, in a first mode, the electrode brings the first photoelectric conversion unit and the second photoelectric conversion unit into a non-conductive state, the first transfer electrode transfers charges accumulated in the first photoelectric conversion unit to the first floating diffusion unit, and the second transfer electrode transfers charges accumulated in the second photoelectric conversion unit to the second floating diffusion unit, and
   wherein, in a second mode, the electrode brings the first photoelectric conversion unit and the second photoelectric conversion unit into a conductive state and the first transfer electrode transfers charges accumulated in the first photoelectric conversion unit and charges accumulated in the second photoelectric conversion unit to the first floating diffusion unit.

12. The image pickup apparatus according to claim 1, further comprising:
   a light-shielding layer configured to block light from reaching the first photoelectric conversion unit;
   a first floating diffusion unit configured to accumulate charges; and
   a first transfer electrode configured to transfer charges accumulated in the first photoelectric conversion unit to the first floating diffusion unit,
   wherein the electrode brings the first photoelectric conversion unit and the second photoelectric conversion unit into a conductive state and transfers charges accumulated in the second photoelectric conversion unit to the first photoelectric conversion unit, and
   wherein, after that, the electrode brings the first photoelectric conversion unit and the second photoelectric conversion unit into a non-conductive state and the first transfer electrode transfers charges accumulated in the first photoelectric conversion unit to the first floating diffusion unit.

13. The image pickup apparatus according to claim 1, further comprising:
   a first floating diffusion unit configured to accumulate charges; and
   a first transfer electrode configured to transfer charges accumulated in the first photoelectric conversion unit to the first floating diffusion unit.

14. The image pickup apparatus according to claim 13, wherein the first floating diffusion unit is a region of the first conductivity type, and
   wherein a peak impurity concentration of the first semiconductor region is lower than that of the first floating diffusion unit.

15. The image pickup apparatus according to claim 10, wherein an impurity concentration of the second photoelectric conversion unit is lower than that of the first photoelectric conversion unit.

16. The image pickup apparatus according to claim 1, further comprising a lens configured to concentrate light on the first photoelectric conversion unit and the second photoelectric conversion unit,
   wherein focus detection is performed using a signal based on charges of the first photoelectric conversion unit and a signal based on charges of the second photoelectric conversion unit.

* * * * *